(12) United States Patent
Saitoh et al.

(10) Patent No.: US 6,306,538 B1
(45) Date of Patent: *Oct. 23, 2001

(54) PORTABLE INFORMATION DEVICE

(75) Inventors: Asao Saitoh, Tokorozawa; Yuichi Kato, Higashiyamato; Shizuo Yamaguchi, Sayama; Yoshikazu Koganei, Higashikurume, all of (JP)

(73) Assignee: Citizen Watch Co., Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/945,499

(22) PCT Filed: Feb. 24, 1997

(86) PCT No.: PCT/JP97/00517

§ 371 Date: Oct. 24, 1997

§ 102(e) Date: Oct. 24, 1997

(87) PCT Pub. No.: WO97/31307

PCT Pub. Date: Aug. 28, 1997

(30) Foreign Application Priority Data

Feb. 26, 1996 (JP) .................................................. 8/061605

(51) Int. Cl.[7] .................................................. H01M 2/10
(52) U.S. Cl. .............................. 429/96; 429/97; 429/99; 429/100; 429/123
(58) Field of Search ........................ 429/97, 99, 100, 429/96, 123, 7, 163, 177

(56) References Cited

U.S. PATENT DOCUMENTS

| | | | |
|---|---|---|---|
| 4,391,883 | * | 7/1983 | Williamson et al. ................. 429/97 |
| 5,039,580 | * | 8/1991 | Mori et al. ........................... 429/97 |
| 5,135,822 | * | 8/1992 | Okamoto ............................. 429/97 |
| 5,149,604 | * | 9/1992 | Nakanishi ........................... 429/97 |
| 5,328,781 | * | 7/1994 | Mikake ............................... 429/97 |

FOREIGN PATENT DOCUMENTS

| | | |
|---|---|---|
| 2-76019 | 3/1990 | (JP) . |
| 2-140815 | 5/1990 | (JP) . |
| 2-23410 | 5/1990 | (JP) . |
| 2-264316 | 10/1990 | (JP) . |
| 3-121515 | 5/1991 | (JP) . |
| 3-134720 | 6/1991 | (JP) . |
| 3-147251 | 6/1991 | (JP) . |
| 4-104388 | 4/1992 | (JP) . |
| 5-135755 | 6/1993 | (JP) . |

* cited by examiner

Primary Examiner—Carol Chaney
(74) Attorney, Agent, or Firm—McDermott, Will & Emery

(57) ABSTRACT

A card body 2 has two battery holding sections (13, 14) inside, and two battery holders (9, 10) each containing a battery are housed therein. The two housed battery holders (9, 10) engage locking portions (22a, 22b) of a stopper (11), thereby setting them unremovable. When the stopper (11) is slid toward one battery holding section (14), the battery holder (10) therein is still kept unremovable, while the other battery holder (9) can be made removable. Thus, even during battery change, at least one battery always remains in the card body to keep supplying a backup voltage to a volatile memory.

13 Claims, 13 Drawing Sheets

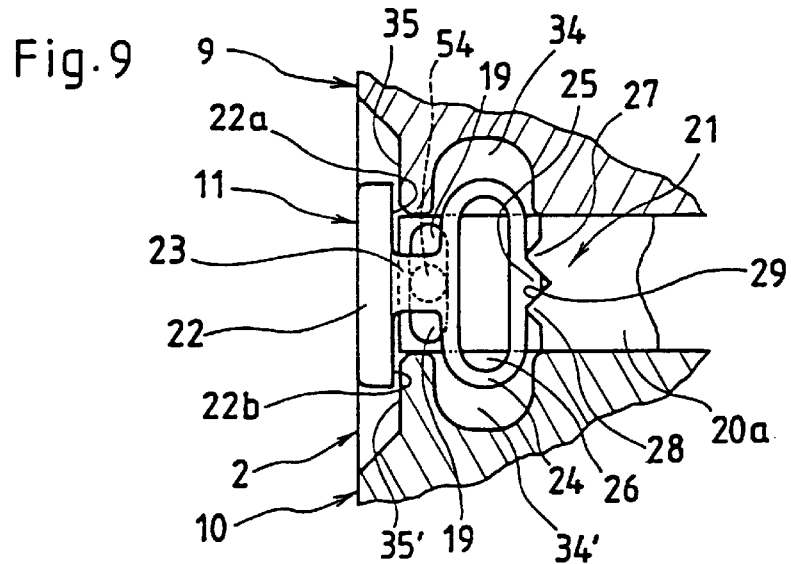
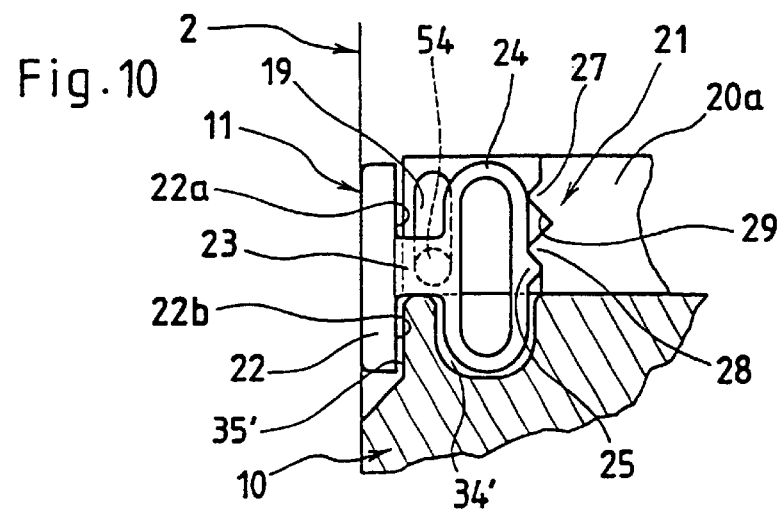
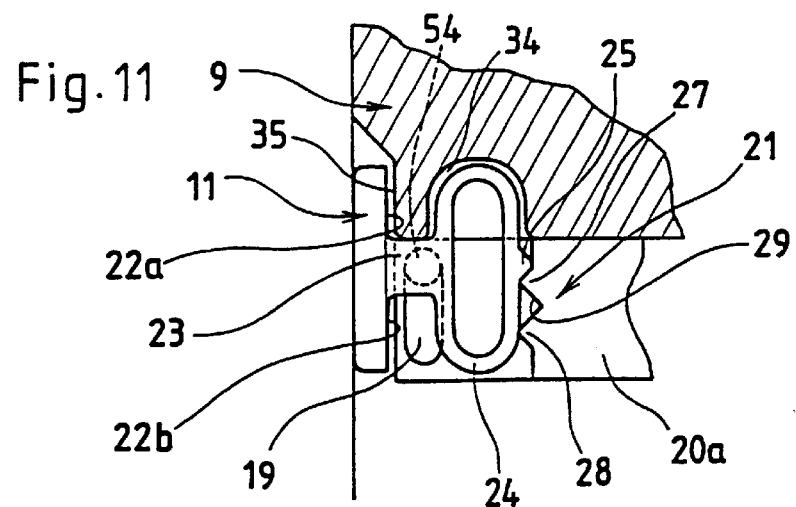

PORTABLE INFORMATION DEVICE

TECHNICAL FIELD

The present invention relates to a portable information device, such as a memory card, provided with a liquid crystal screen and a volatile memory and capable of retaining stored data by means of batteries even without external power input.

BACKGROUND ART

Disclosed in Japanese patent publications, such as Patent Application KOKAI Nos. 2-23410, 2-140815, 2-264316, 3-121515 and 3-134720, are memory cards, that comprise a static RAM (SRAM) formed of a volatile semiconductor memory, a replaceable main battery as a backup power source for retaining information stored in the SRAM, and a sub-battery connected in parallel with the main battery and used as a backup power source for the SRAM when the main battery is being replaced.

Further, disclosed in Japanese patent publications, such as Patent Application KOKAI Nos. 2-76019 and 3-134720, are memory cards that comprise a battery holder, designed to contain a main battery and to be capable of being loaded into and unloaded from a memory card body, and a locking lever slidable in the memory card and designed to permit or prohibit attachment to and removal of the battery holder from the memory card body by engaging or being disengaged from the battery holder.

Also disclosed in a Japanese patent publication is, Patent Application KOKAI No. 4-104388 relating to a memory card that comprises a RAM, batteries, and an element for switching between the source voltage and an externally supplied voltage, wherein a plurality of batteries for supplying the source voltage are connected in series in the memory card. This memory card is designed to reduce the difference between the supply voltage having so far been supplied externally and the backup source voltage in the memory card, thereby avoiding the destruction of data stored in the memory when the memory card is removed from an external apparatus. Further, the batteries for supplying the backup source voltage are connected in series, so that when the batteries are dead, they must be replaced with new ones with the memory card connected to the external apparatus or the like.

Thus, in the case of a portable information devices such as memory cards, a complicated mechanism has to be used in replacing batteries while maintaining the source voltage for the volatile memory (RAM).

DISCLOSURE OF THE INVENTION

The object of the present invention is to provide a portable information device, such as a memory card with two batteries connected in series for supplying power to a load circuit, which is designed so that the batteries can be changed without suspending the power supply to the load circuit.

In order to achieve the above object, a portable information device according to the present invention comprises a body casing containing a circuit board and having first and second battery insertion slots in one end portion thereof, first and second battery holding sections provided in the internal space of the body casing and communicating with the first and second battery insertion slots, respectively, and a locking member for restraining batteries from being removed from the first and second battery insertion slots. The locking member is designed so as to be able to establish a first state in which the batteries housed in the first and second battery holding sections are prohibited from being taken out simultaneously from both the first and second battery insertion slots, a second state in which the battery is allowed to be taken out from the first battery insertion slot but is prohibited from being taken out from the second battery insertion slot, and a third state in which the battery is allowed to be taken out from the second battery insertion slot but is prohibited from being taken out from the first battery insertion slot.

Preferably, a member constituting the two battery holding sections forms a guide portion capable of receiving the circular batteries or battery holders containing the circular batteries through the battery insertion slots of the body casing and guiding to and holding them in predetermined positions. In a type such that the battery holders containing the batteries therein are housed individually in the battery holding sections, a part of the locking member engages a portion of each battery holder, thereby prohibiting the battery holder from being taken out. On the other hand, in a type such that the circular batteries are housed directly in the battery holding sections, battery covers are disposed facing the battery insertion slots of the body casing so that a part of the locking member engages the free end of each battery cover, thereby prohibiting each battery from being taken out.

Further preferably, the member constituting the battery holding sections is fixed to a battery connecting springs for individually connecting the batteries housed in the battery holding sections and power source terminals of the circuit board in the body casing.

Further preferably, moreover, the two battery holding sections and two battery covers are formed of one integrally molded piece of plastics. Further, the battery connecting springs are made available by punching a junction of one metal plate having a shape such that they are connected with one another through the junction.

BRIEF DESCRIPTION OF THE DRAWINGS

FIG. 9 is an enlarged view showing the principal part of FIG. 6;

FIG. 10 is an enlarged view showing the principal part of FIG. 7;

FIG. 11 is an enlarged view showing the principal part of FIG. 8;

BEST MODE FOR CARRYING OUT THE INVENTION

A first embodiment of the present invention will be described first.

Figure 1:
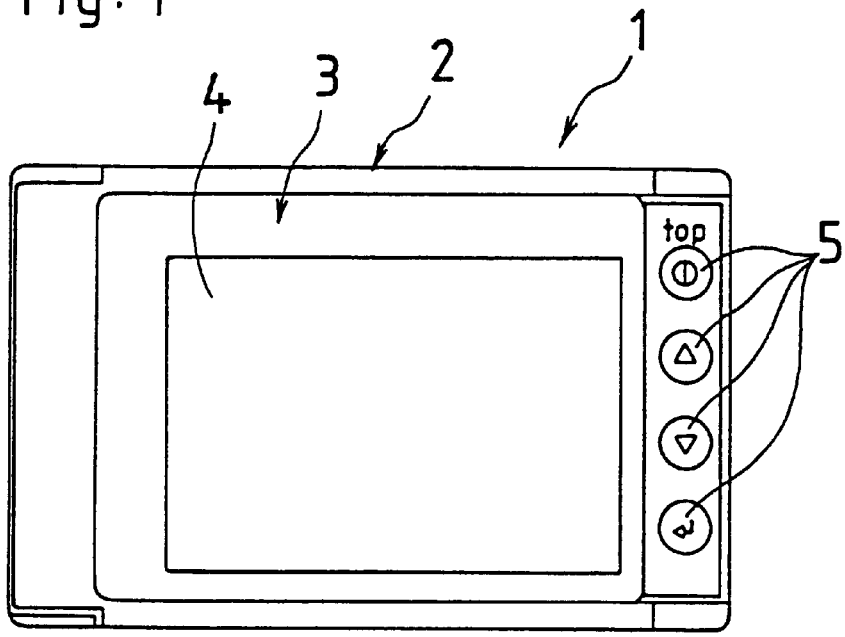
FIG. 1 is a plan view of a memory card as an example of a portable information device according to the present invention.
Figure 2:
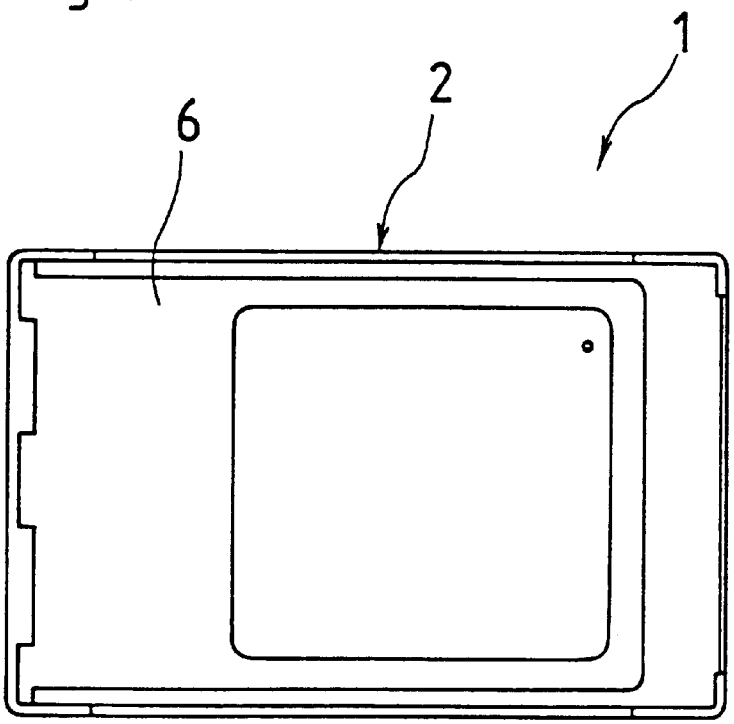
FIG. 2 is a rear view of the memory card of FIG. 1.

A memory card 1 for use as a portable information device has a thin-wall rectangular form, and a display section 4 of a liquid crystal display unit 3 is provided in the center of the surface of a card body 2. A plurality of operator input keys 5 (four in number in FIG. 1) are arranged on a portion of the surface of the card body 2, which are situated near one short side of the card body 2. On the rear side of the memory card 1, as shown in FIG. 2, a rear plate 6 is screwed to the card body 2.

Figure 3:
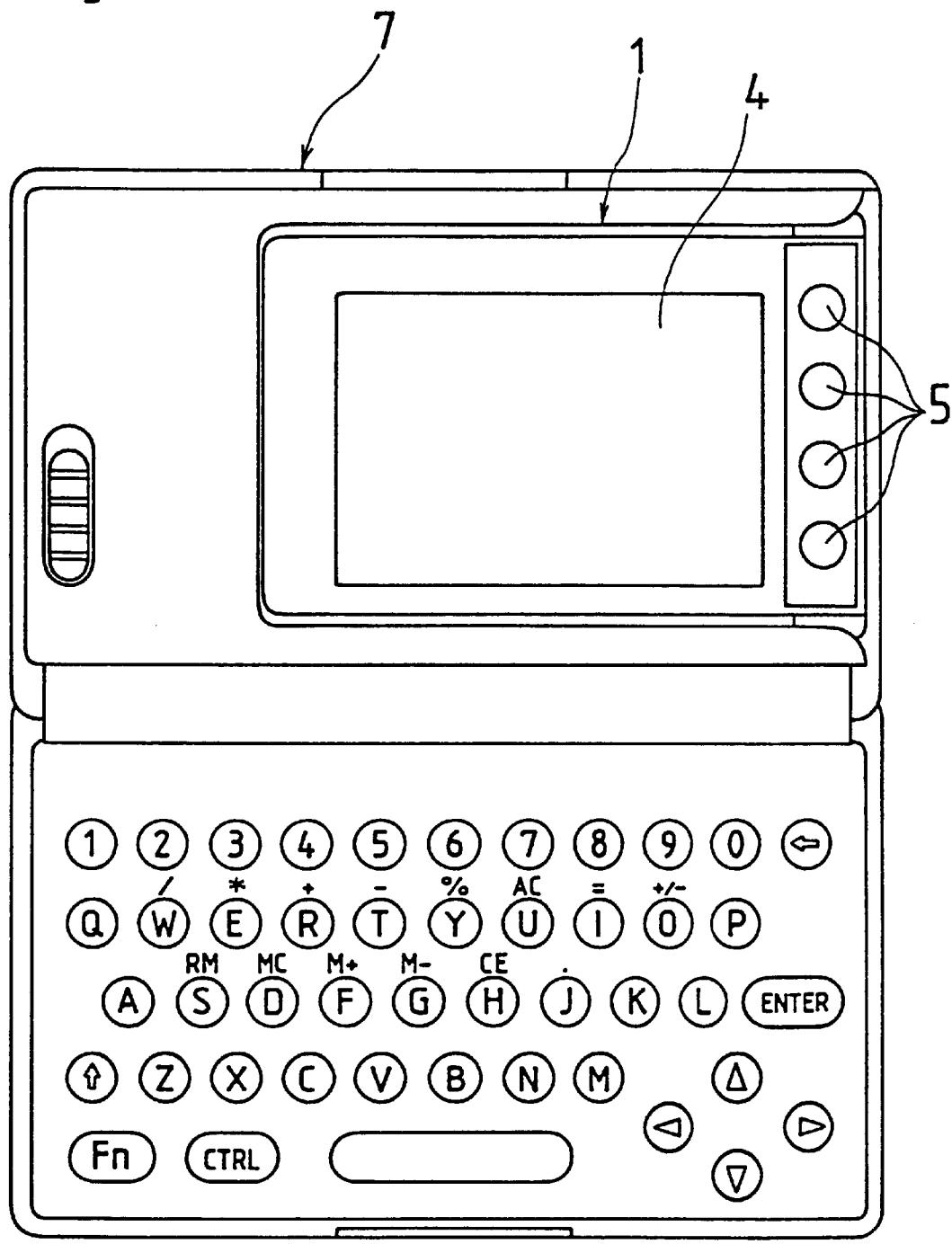
FIG. 3 is a view showing the memory card of FIG. 1 attached to an external apparatus.
Figure 4:
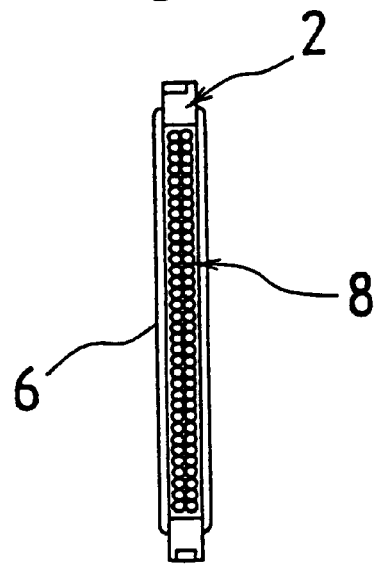
FIG. 4 is a left-hand side view of the memory card of FIG. 1.

A connector 8, which includes a large number of signal terminals and external power supply terminals arranged in parallel to each other, as shown in FIG. 4, is provided on the end face of the card body 2 which corresponds to the side opposite to the side on which the operator input keys 5 are arranged. The memory card 1 is connected to a connecting terminal (not shown) of an external apparatus, such as a keyboard apparatus 7 shown in FIG. 3, through the connector 8, and a memory in the memory card 1 is loaded.

The connector 8 conforms to the standards of JEIDA (Japan Electronic Industry Development Association) and PCMCIA (Personal Computer Memory Card International Association), and can be connected to a connector attached to a personal computer (not shown) so that the memory card 1 can be stored with data from the personal computer.

Figure 5:
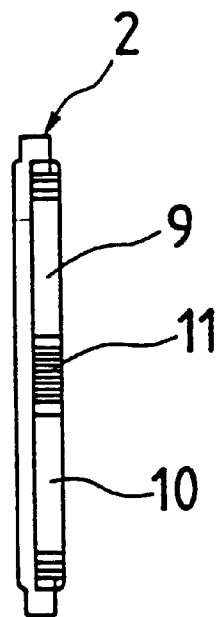
FIG. 5 is a right-hand side view of the memory card of FIG. 1.

As shown in FIG. 5, two battery holders 9 and 10 for separately holding two batteries (not shown) are arranged individually on the right-hand end face of the card body 2 so as to be attachable to and detachable from the card body 2. A stopper 11 for containing the battery holders 9 and 10 within the card body 2 is provided between the two battery holders 9 and 10 so as to be slidable in the width direction of the card body 2.

Figure 6:
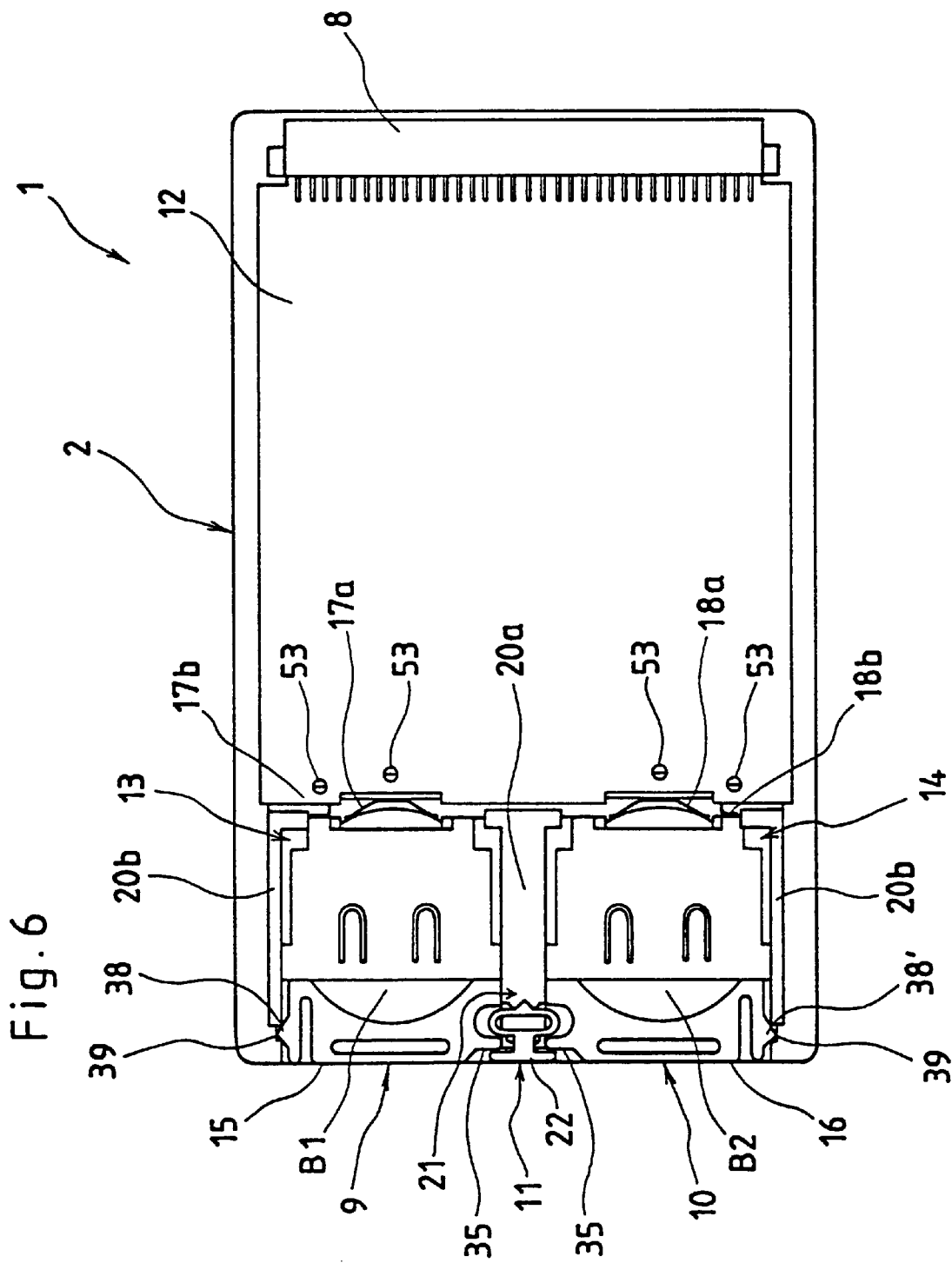
FIG. 6 is a view showing the interior (according to a first embodiment of the present invention) of the memory card of FIG. 1 with its rear plate removed.

As shown in FIG. 6, a printed wiring board 12 and the two removable battery holders 9 and 10 are housed in a housing space that is defined by the card body 2 and the rear plate 6. The printed wiring board 12 incorporates elements and circuits, such as an SRAM (not shown) as a volatile memory for data storage, a driver (not shown) for driving the display unit 3 for display, a CPU (not shown) for reading the stored data from the volatile memory and causing the display unit 3 to display them, and a ROM (not shown). Also, batteries B1 and B2 housed in the battery holders 9 and 10 serve as a power source for retaining data stored in the SRAM and for actuating the display unit 3, driver, and control device.

Two battery holder housing sections 13 and 14 having the same shape are juxtaposed on the side of the card body 2 opposite to the side of the connector 8. The end portion of the card body 2 on the side opposite to the side where the connector 8 is provided overlaps the end portion of each of the battery holder housing sections 13 and 14, forming two battery holder insertion slots 15 and 16. On the other hand, leaf springs 17a, 17b, 18a and 18b are arranged individually on those respective ends of the battery holder housing sections 13 and 14 on the side opposite to the battery holder insertion slots 15 and 16. In FIG. 6, the positive and negative terminals of the battery B1 are in contact with the leaf springs 17a and 17b, respectively, while the positive and negative terminals of the battery B2 are in contact with the leaf springs 18a and 18b, respectively. Numeral 53 denotes soldered portions of individual leaf springs 17a, 17b, 18a and 18b.

Figure 7:
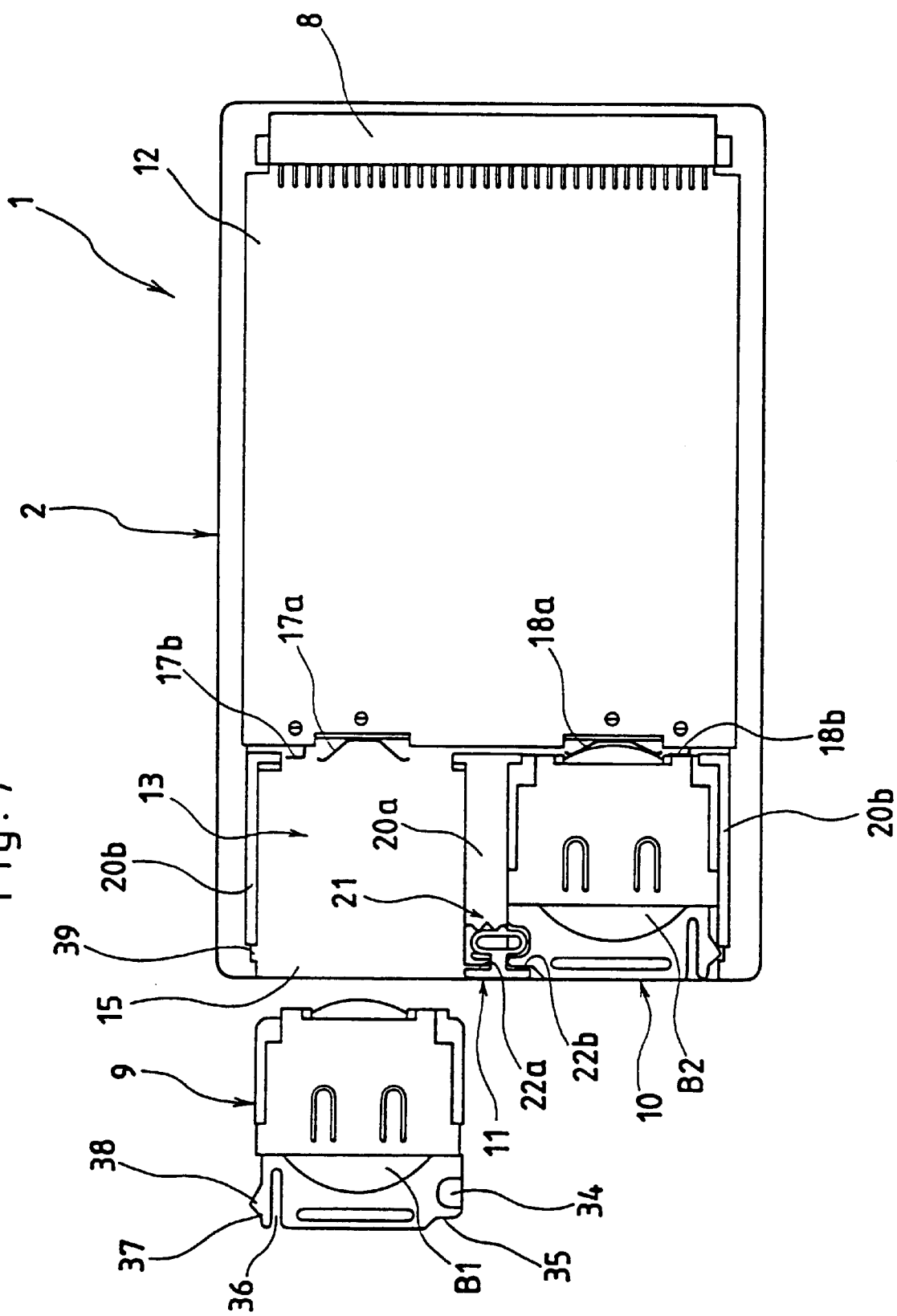
FIG. 7 is a view showing the memory card of FIG. 6 with its left-hand side battery holder removed.

As shown in FIG. 7, the two battery holder housing sections 13 and 14 are formed by arranging a plastic central guide portion 20a and plastic left- and right-hand side guide portions 20b between the card body 2 and the rear plate 6. More specifically, one (left-hand) battery holder housing section 13 is defined by the central guide portion 20a and one side guide portion 20b, while the other (right-hand) battery holder housing section 14 is defined by the central guide portion 20a and the other side guide portion 20b. Further, the central guide portion 20a, which divides the two battery holder housing sections 13 and 14, is formed with a projection of a stopper positioning portion 21 at its front portion, and an oblong slide knob guide slot 19 in its front end portion.

As shown in FIG. 9, the stopper 11 includes a slide knob 22, a leg 23 connected to the slide knob 22, and an overhang portion 24 formed at the distal end of the leg 23 so as to be oblong in the width direction of the card body 2. Further, the leg portion 23 is provided integrally with a guide pin 54 that extends in the thickness direction of the card body 2. The guide pin 54 is situated in the slide knob guide slot 19 in the guide portion 20a, whereby its movement is regulated. Also, an angular positioning projection 25 is formed on the side of the overhang portion 24 opposite to the leg portion 23.

In FIG. 9, the positioning projection 25 of the overhang portion 24 is in engagement with an engaging recess 29 between two projections 27 and 28 of the stopper positioning portion 21 that is formed at one end of the central guide portion 20a. In this condition, when the slide knob 22 is manually slid to either side (upward or downward direction in FIG. 9), the overhang portion 24, because of having a slot 26, easily undergoes elastic deformation, and the positioning projection 25 of the overhang portion 24 is disengaged from the engaging recess 29 of the stopper positioning portion 21.

When the slide knob 22 in the position of FIG. 9 (central position) is manually slid to one side (side on which the battery holder 10 is housed), the guide pin 54 is guided by the oblong slide knob guide slot 19 formed in the guide portion 20a, causing the positioning projection 25 of the overhang portion 24 to be disengaged from the engaging recess 29 of the stopper positioning portion 21 and to be brought to the position shown in FIG. 10. When the slide knob 22 is slid to the opposite side (side on which the battery holder 9 is housed), the positioning projection 25 of the overhang portion 24 and the stopper positioning portion 21 engage each other in the manner shown in FIG. 11.

The batteries B1 and B2 housed in the battery holders 9 and 10 are disk-shaped lithium batteries, and their respective negative terminals appear in FIG. 6, which shows the interior of the card body with its rear plate 6 removed.

Figure 12:
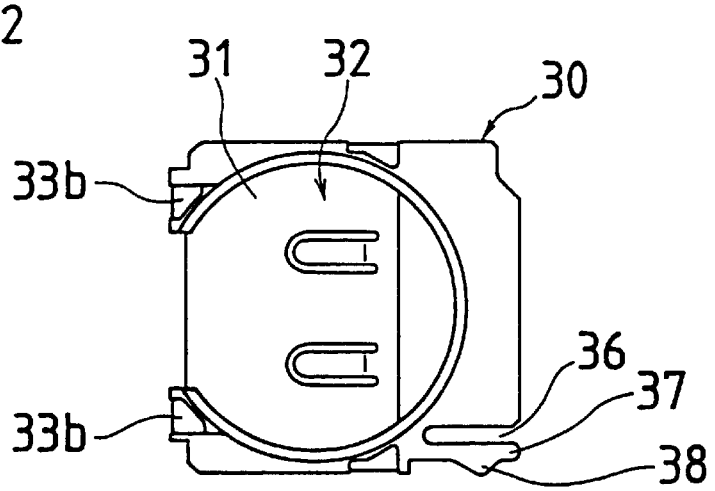
FIG. 12 is a plan view of a battery holder to be contained in the memory card of FIG. 1.
Figure 13:
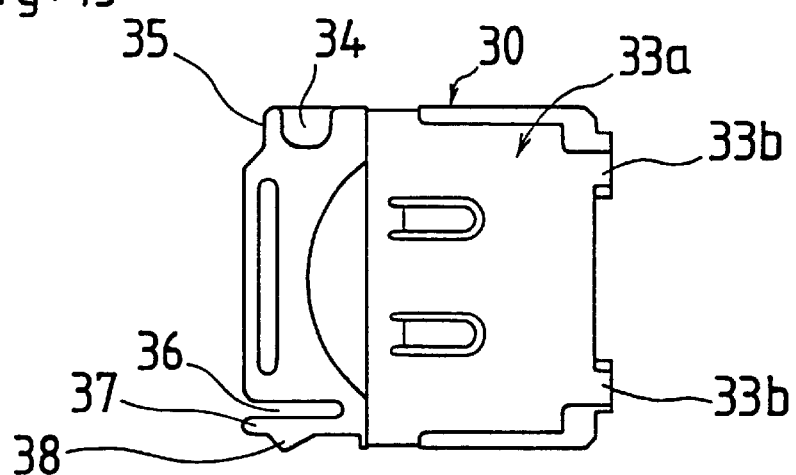
FIG. 13 is a bottom view of the battery holder of FIG. 12.

As shown in FIG. 12, each of the battery holders 9 and 10 is composed of a holder body 30 and a negative terminal spring 31. As shown in FIG. 12, a battery holding recess 32 is provided in the center of one surface of the holder body 30. Further, the negative terminal spring 31 is located inside the battery holding recess 32. As shown in FIG. 13, moreover, a negative terminal connecting plate 33a is mounted on a surface (hereinafter referred to as bottom surface) of the holder body 30, opposite to the surface (hereinafter referred to as top surface) in which the battery holding recess 32 is provided. Negative terminal connecting portions 33b of the negative terminal connecting plate 33a extend to the rear end of the holder body 30, as shown in FIG. 13, and are then bent so that their respective distal ends extend up to the top surface of the holder body 30, as shown in FIGS. 12 and 14.

As shown in FIG. 13, a semielliptic evacuation recess 34 and a flat engagement portion 35 are formed on one side of the bottom surface of the holder body 30 near the front end thereof, while a slit 36 and an engaging piece 37 are formed on the other side. Further, an angular engaging claw portion 38 is formed on the outer surface of the engaging piece 37.

Figure 14:
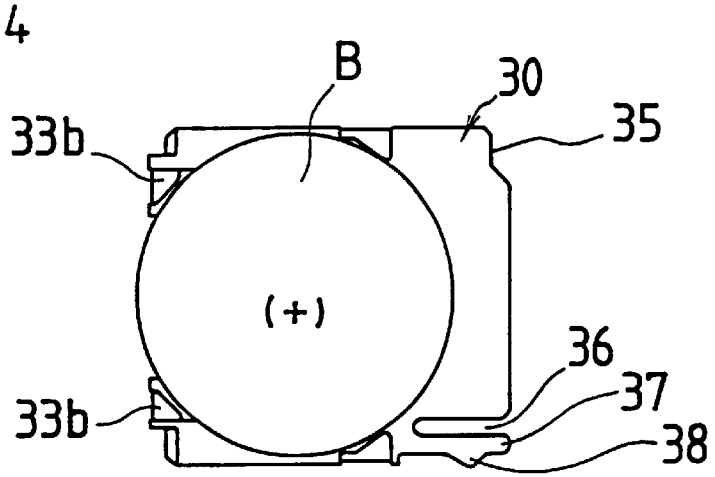
FIG. 14 is a plan view of the battery holder of FIG. 12 with a battery installed therein.

As shown in FIG. 14, the battery B is inserted into the battery holding recess 32 through the top surface of the holder body 30.

The following is a description of attachment and removal of the battery holders 9 and 10 to and from the card body 2.

When the battery holders 9 and 10 containing the batteries B1 and B2 therein are attached to the card body 2, as shown in FIGS. 6 and 9, the stopper 11 takes a middle position between shift positions. When the stopper 11 is in this position, left- and right-hand locking portions 22a and 22b formed on the rear surface of its slide knob 22 are in engagement with engagement portions 35 and 35' of the battery holders 9 and 10, respectively. Thus, both the left- and right-hand battery holders 9 and 10 are unremovable.

The battery holder 9, when set to be removable, is forced toward the holder insertion slot 15 by the leaf springs 17a and 17b that are attached to the innermost end of the battery holder housing section 13. Further, the engaging claw portion 38 (see FIGS. 7 and 13) on one side of the battery holder 9 near the front end thereof is in engagement (see FIG. 6) with a stepped portion 39 that is formed on the front portion of the guide portion 20b of the battery holder housing section 13. Likewise, the battery holder 10 is urged toward the holder insertion slot 16 by the leaf springs 18a and 18b that are attached to the innermost end of the battery holder housing section 14. Furthermore, an engaging claw portion 38 (see FIG. 7) on one side of the battery holder 10 near the front end thereof is in engagement (see FIG. 6) with a stepped portion 39 that is formed on the front portion of the guide portion 20b of the battery holder housing section 14.

As will be described later, the batteries B1 and B2 housed in the battery holder housing sections 13 and 14 are connected in series with each other. When the card body 2 is separated from the keyboard apparatus 7, the electromotive force of the series-connected batteries B1 and B2 serves as a backup power source for the volatile memory, that is provided on the card body 2, and retains the data stored in the volatile memory.

In changing dead batteries, one of the battery holders 9 and 10 is first removed from the card body 2, the battery in the removed battery holder is replaced with a new one, and the battery holder having the changed battery therein is inserted again into the card body 2 to be mounted therein. Then, removing the remaining battery holder, having its battery unchanged, from the card body 2, the battery in the battery holder is replaced with a new one, and the battery holder having the changed battery therein is inserted again into the card body 2 to be mounted therein. That is, the battery holders 9 and 10 cannot be removed simultaneously.

Described first in the following is the procedure for removing the battery holder 9 for replacing the battery B1. First, the slide knob 22 of the stopper 11 is manually slid away from the battery holder 9 (or toward the battery holder 10). Thereupon, the positioning projection 25 of the stopper 11 is subjected to the sliding force, causing the overhang portion 24 to be elastically deformed, and the positioning projection 25 of the stopper 11 and the engaging recess 29 of the stopper positioning portion 21 on the side of the card body 2 are disengaged from each other. Then, the positioning projection 25 gets over the projection 28 of the stopper positioning portion 21, and reaches the position shown in FIG. 10. In this condition, the right-hand side of the overhang portion 24 of the stopper 11 gets into an evacuation recess 34' in the flank of the battery holder 10 (see FIG. 10).

The right-hand locking portion 22b of the slide knob 22 of the stopper 11 in the position shown in FIG. 10 is situated overlapping the engagement portions 35' on the front end face of the battery holder 10. On the other hand, the left-hand locking portion 22b of the slide knob 22 is not situated overlapping the engagement portion 35 on the front end face of the battery holder 9. When the battery holder 9 is drawn out, therefore, its engagement portion 35 will never be caught by the slide knob 22. Further, the engaging claw portion 38, which is located close to the front end of the battery holder 9, is in engagement with the stepped portion 39 of the guide portion 20b; however, when the battery holder 9 is manually drawn out toward the holder insertion slot 15, the engaging claw portion 38 is easily deformed toward the slit 36, so that it can get out of the stepped portion 39. When the stopper 11 is in the position of FIG. 10, therefore, the battery holder 9 can be removed from the card body 2.

Moreover, in this condition, the electromotive force of the battery B2 in the unremoved battery holder 10 serves as a backup power source for the volatile memory, and retains the data stored in the volatile memory.

The battery B1 is taken out from the removed battery holder 9 and replaced with a new one, which is then loaded into the battery holder 9. This battery holder 9 is inserted and loaded into the battery holder housing section 13 through the holder insertion slot 15 of the card body 2.

When the battery holder 9 is inserted into the battery holder housing section 13 through the holder insertion slot 15 of the card body 2 (see FIG. 7), the engaging claw portion 38 of the battery holder 9 is pressed against the inner edge of the holder insertion slot 15, whereupon the engaging piece 37 is elastically deformed toward the slit 36. When the rear end of the battery holder 9 reaches the innermost end of the battery holder housing section 13, the elastically deformed engaging piece 37 restores its shape and engages the stepped portion 39 of the battery holder housing section 13. At the same time, the leaf springs 17a and 17b, attached to the innermost end of the battery holder housing section 13, are compressed by the battery holder 9. While maintaining this state, the stopper 11 is slid to return from a shift position at one end in the sliding direction shown in FIG. 10 to the middle shift position shown in FIG. 9, whereby the battery holders 9 and 10 are prevented from being removed.

Figure 8:
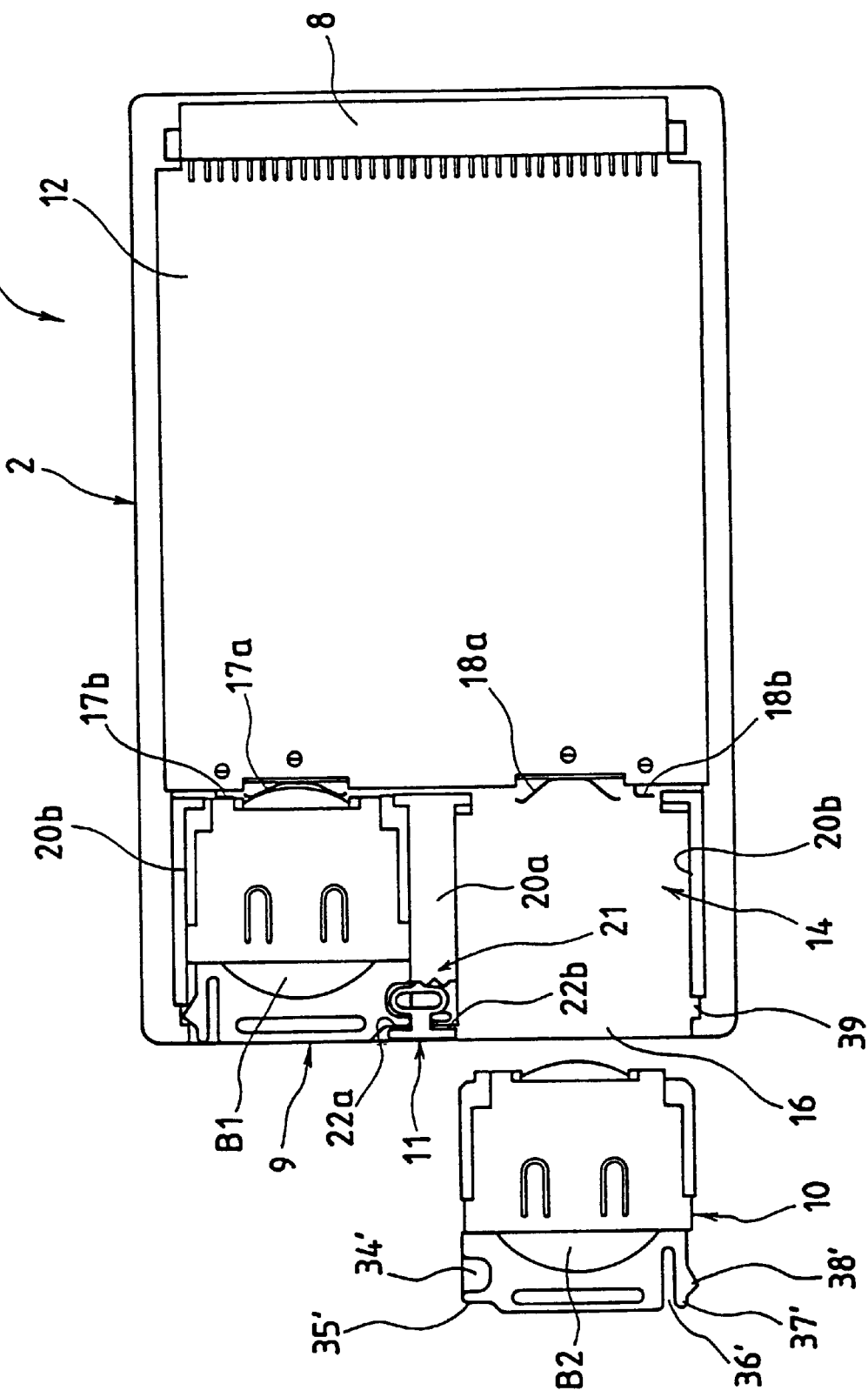
FIG. 8 is a view showing the memory card of FIG. 6 with its right-hand side battery holder removed.

Then, to remove the battery holder 10, having its battery unchanged, from the card body 2, the slide knob 22 of the stopper 11 is manually slid away from the battery holder 10 (or toward the battery holder 9, see FIG. 11). Thereafter, the battery holder 10 is taken out to replace battery B2 with a new one, and the battery holder 10 is loaded again into the battery holder housing section 14. The description of these steps of procedure (see FIG. 8), is omitted here, since they are similar to those given previously in connection with the battery holder 10.

Referring now to the wiring diagram of FIG. 15, electrical circuits between the batteries B1 and B2 and a load will be described.

The positive terminal of the one battery B1, out of the two series-connected batteries B1 and B2, is connected to a regulator circuit 42 through a positive terminal line 40. On the other hand, the negative terminal of the other battery B2 is connected to a load circuit 43 through a negative terminal line 41. The regulator circuit 42 is connected in series with the load circuit 43.

Both the batteries B1 and B2 are lithium batteries. If these batteries are new ones, they have an electromotive force of 3.3 V each. The load circuit 43 includes a CPU, ROM, SRAM as a volatile memory, liquid crystal driver circuit, switching circuit, etc. (none of which are shown).

If a voltage applied to the regulator circuit 42 is higher than a preset level (3.0 V according to the present embodiment), it is outputted after being transformed to the set level (3.0 V). If the level of the input voltage is lower than the preset level (3.0 V), on the other hand, the input voltage is directly passed (with a loss of about 10 percent) and outputted.

Two diodes D1 and D2 are connected in series in the forward direction between the positive terminal of the battery B1 and the negative terminal of the battery B2. Also, a reverse-current checking diode D4 is provided between the positive terminal of the battery B1 and an input terminal of the regulator circuit 42.

A node 47 between the series-connected batteries B1 and B2 and a node 48 between the series-connected diodes D1 and D2 are connected through a trunk line 49.

Further, one end of an external power line 51 is connected to a node (node 50) between the reverse-current checking diode D4 on the positive terminal line 40 and the input terminal of the regulator circuit 42. The external power line 51 is connected to an external power supply terminal 52 of the external power line 50 through an external power supply diode D3. Thus, the external power line 51 is connected to the cathode of the reverse-current checking diode D4 via the node 50. On the other hand, the anode of the reverse-current checking diode D4 is connected to the positive terminal of the battery B1, and is also connected to the positive terminal of the battery B2 via the diode D1. Accordingly, an electric current from the external power supply terminal 52 is intercepted by the reverse-current checking diode D4, and never flows into the batteries B1 and B2.

Figure 15:
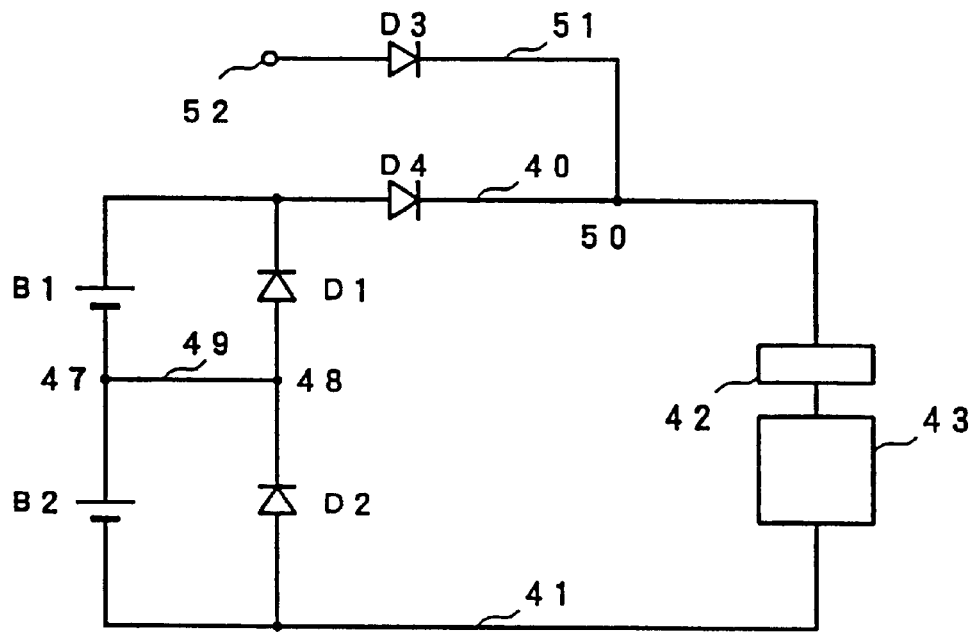
FIG. 15 is a diagram showing electrical circuits formed between two batteries of the memory card of FIG. 6 and a load.

The following is a description of the operation of the circuit of FIG. 15.

The series-connected batteries B1 and B2 supplies the load circuit 43 with the sum of an electromotive force $V_{B1}$ of the battery B1 and an electromotive force $V_{B2}$ of the battery B2, i.e., $V_{B1}+V_{B2}$, as a source voltage via the reverse-current checking diode D4 and the regulator circuit 42.

Moreover, when the external power supply terminal 52 of the external power line 51 is connected to an external apparatus, the external power supply terminal 52 is supplied with a DC supply voltage $V_{IN}$ from the external apparatus.

With the memory card connected to the external apparatus, when the DC supply voltage $V_{IN}$ supplied from the external apparatus is higher than the sum, $V_{B1}+V_{B2}$, of the respective electromotive forces $V_{B1}$ and $V_{B2}$ of the batteries B1 and B2, that is, when $V_{IN}>(V_{B1}+V_{B2})$, the supply voltage $V_{IN}$ is supplied as an external power source to the load circuit 43 through the external power supply diode D3 and the regulator circuit 42. In this condition, the reverse-current checking diode D4 inhibits a charging current derived from the supply voltage $V_{IN}$ from flowing into the batteries B1 and B2. The voltage $V_{IN}$ of the external power source is supplied to the load circuit 43 after being transformed to 3.0 V by the regulator circuit 42.

When the memory card 1 is removed from the external apparatus so that the memory card 1 and the external apparatus are disconnected from each other, the load circuit 43 is supplied with $V_{B1}+V_{B2}$, the sum of the respective electromotive forces $V_{B1}$ and $V_{B2}$ of the batteries B1 and B2, as the source voltage, via the reverse-current checking diode D4 and the regulator circuit 42. If both the batteries B1 and B2 are new ones, since they are connected in series with an electromotive force of 3.3 V respectively, a supply voltage of 6.6 V is applied to the regulator circuit 42, and is supplied to the load circuit 43 after being transformed to 3.0 V by the regulator circuit 42.

When the DC supply voltage $V_{IN}$ supplied from the external apparatus with the memory card 1 connected thereto is lower than the sum, $V_{B1}+V_{B2}$, of the respective electromotive forces $V_{B1}$ and $V_{B2}$ of the batteries B1 and B2, that is, when $V_{IN}<(V_{B1}+V_{B2})$, the load circuit 43 is supplied with power from the batteries B1 and B2.

Figure 16:
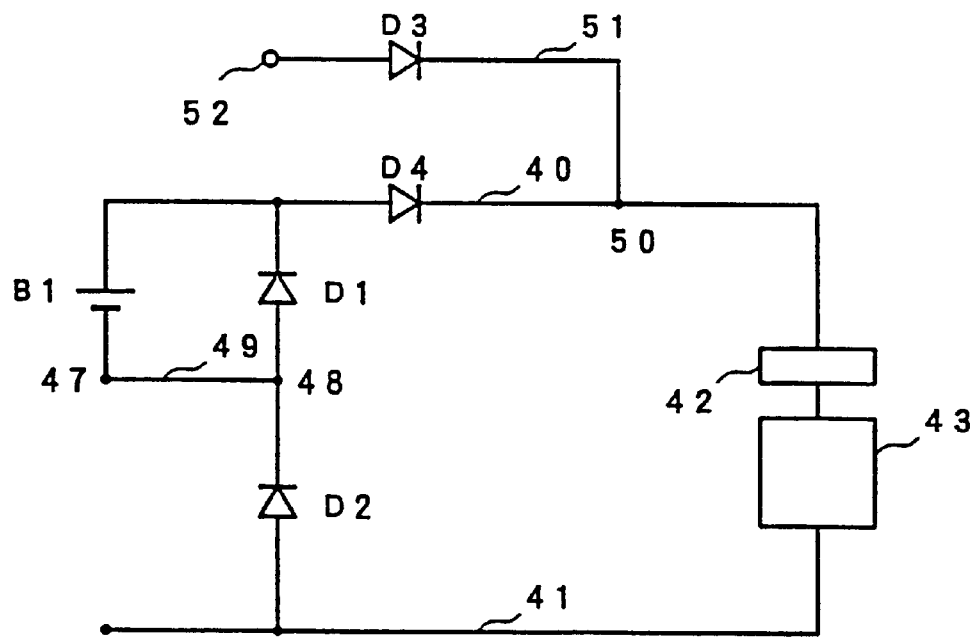
FIG. 16 is a diagram showing an electrical circuit formed between the remaining battery and the load when one of the batteries is removed from the circuit of FIG. 6.

When the batteries B1 and B2 are exhausted with their electromotive forces $V_{B1}$ and $V_{B2}$ ranging from about 3.0 to 2.9 V, they must be replaced with new ones. Referring to FIG. 16, the circuits with the one battery B2 removed will be described first.

In FIG. 16, the remaining battery B1 applies the electromotive force $V_{B1}$ (3.0 to 2.9 V) of the battery B1 to the regulator circuit 42 via the reverse-current checking diode D4, regulator circuit 42, load circuit 43, and diode D2. The regulator circuit 42 directly passes the electromotive force $V_{B1}$ of the battery B1 (with a loss of about 10 percent), and supplies it to the load circuit 43. At this time, a voltage supplied from the battery B1 to the load circuit 43 through the regulator circuit 42 serves as a backup power source for the SRAM of the load circuit, and retains data in the SRAM of the load circuit 43.

Figure 17:
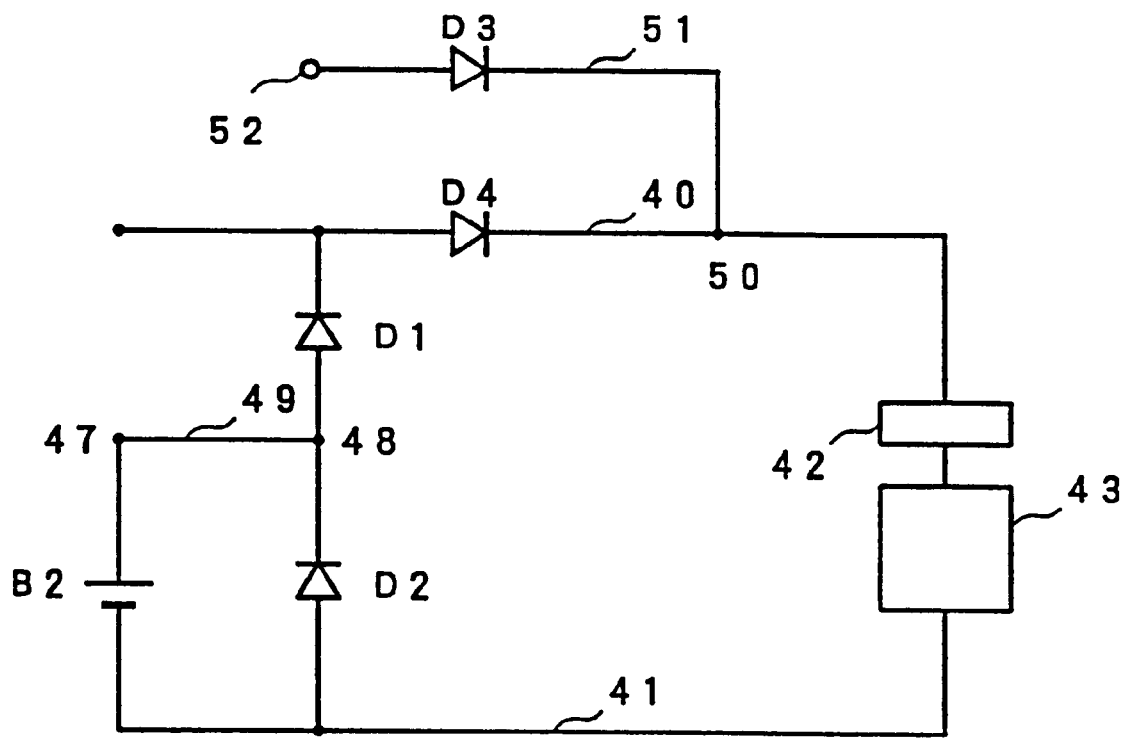
FIG. 17 is a diagram showing an electrical circuit formed between the one battery and the load when the other battery is removed from the circuit of FIG. 6.

After the battery B2 is replaced with a new one, the battery B1 is removed for replacement. FIG. 17 shows a state in which the battery B1 is removed. In FIG. 17, the battery B2 applies its electromotive force $V_{B2}$ to the regulator circuit 42 via the diode D1, reverse-current checking diode D4, regulator circuit 42, and load circuit 43. The regulator circuit 42 transforms the electromotive force $V_{B2}$ (3.3 V) of the battery B2 to 3.0 V, and supplies it to the load circuit 43. At this time, a voltage supplied from the battery B2 to the load circuit 43 through the regulator circuit 42 serves as a backup power source for the SRAM of the load circuit 43, and retains the data in the SRAM of the load circuit 43. After this, the battery B1 is replaced with a new one, and the circuits of FIG. 15 are constructed again.

As described above, in the case where the one battery B2 is removed for battery replacement, the remaining other battery B1 functions as the backup power source for the volatile memory. When the other battery B1 is removed for replacement after the one battery B2 is replaced with a new one, the newly changed battery B2 functions as the backup power source for the volatile memory. Thus, the batteries can be changed one by one without stopping the power supply to the volatile memory, so that the data stored in the volatile memory can be retained.

If the DC supply voltage $V_{IN}$ supplied from the external apparatus with the memory card 1 connected thereto, with the battery B2 removed as shown in FIG. 16 or with the battery B1 removed as shown in FIG. 17, is higher than the electromotive force $V_{B1}$ of the battery B1 or the electromotive force $V_{B2}$ of the battery B2, that is, when $V_{IN} > V_{B1}$ or $V_{IN} > V_{B2}$, the supply voltage $V_{IN}$ is supplied as an external power source to the load circuit 43 through the external power supply diode D3 and the regulator circuit 42. In this case, the reverse-current checking diode D4 prevents the charging current derived from the supply voltage $V_{IN}$ from flowing into the batteries B1 and B2. The voltage $V_{IN}$ of the external power source is supplied to the load circuit 43 after being transformed to 3.0 V by the regulator circuit 42.

As described above, according to the first embodiment, the two battery holder housing sections 13 are formed by arranging the guide portions 20a, 20b and 20b in the space defined by the card body 2 and the rear plate 6, and the battery holders 9 and 10, containing the batteries B1 and B2, respectively, are housed individually in the battery holder housing sections 13. The positive terminal leaf springs 17a and 18a to be in contact with the respective positive terminals of the batteries B1 and B2 and the negative terminal leaf springs 17b and 18b to be in contact with the respective negative terminals are soldered individually at the spots designated by numeral 53 in FIG. 6.

Referring now to FIGS. 18 to 22, a second embodiment, an alternative to the first embodiment, will be described.

According to the second embodiment, battery holding sections are formed in a space defined between a card body 2 and a rear plate 6, and batteries B1 and B2 are housed directly in the battery housing sections (that is, not in the battery holder housing sections 13) and taken out therefrom, individually. Further, positive and negative terminal leaf springs to be in contact with the batteries B1 and B2 are characterized by being mounted in the plastic battery holding sections without being soldered to any circuit board.

Figure 18:
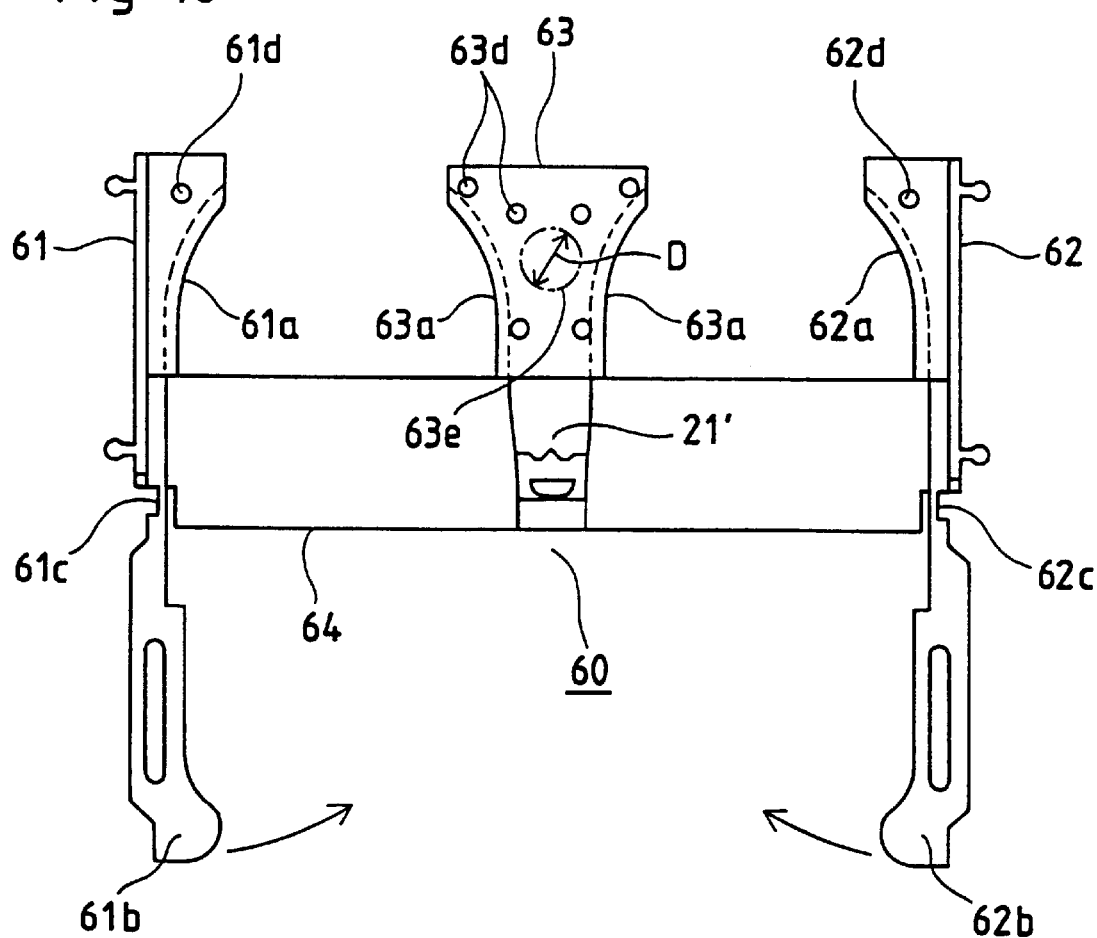
FIG. 18 is a plan view of a battery holding frame as one component of a memory card according to a second embodiment of the present invention.

Referring first to FIG. 18, there will be described a battery holding frame, which is inserted in the space defined between the card body 2 and the rear plate 6, thereby forming the two battery holding sections.

This battery holding frame 60 is a substitute member for the guide portions 20a and 20b according to the first embodiment, and is an integral molded piece of plastics, including a left-hand member 61, right-hand member 62, central member 63, and connecting member 64 for connecting these members 61, 62 and 63, as shown in FIG. 18.

The left- and right-hand members 61 and 62 are provided with wall-shaped guide portions 61a and 62a, respectively, which serve to guide the batteries to be set, taken out, or held in position. Each of these guide portions 61a and 62a has a predetermined height (on the back of the drawing paper of FIG. 18), and guides each battery by its circular peripheral surface. Thus, one of the batteries is positioned by means of the guide portion 61a of the left-hand member 61 and a guide portion 63a of the central member 63, while the other of the batteries is positioned by means of the guide portion 62a of the right-hand member 62 and another guide portion 63a of the central member 63.

The left- and right-hand members 61 and 62 are formed integrally with their corresponding battery covers 61b and 62b through narrow portions 61c and 62c formed substantially in the middle, respectively. These battery covers 61b and 62b can be easily bent inward (in the directions of the arrows of FIG. 18) by external force.

Further, the central member 63 is formed with a stopper positioning portion 21' that has the same function as the stopper positioning portion 21 (see FIG. 6) according to the first embodiment. Furthermore, the central member 63 is formed with a through hole 63e having a diameter D. Four thin and short protrusions 63d are formed around the through hole 63e. Also, the left- and right-hand members 61 and 62 are formed with protrusions 61d and 62d, respectively, which have the same thickness and height as the protrusions 63d. These protrusions 63d, 61d and 62d are formed on the side (i.e., the face side of the drawing paper of FIG. 18) opposite to the side on which the guide portions 63a, 61a and 62a are arranged.

Figure 19:
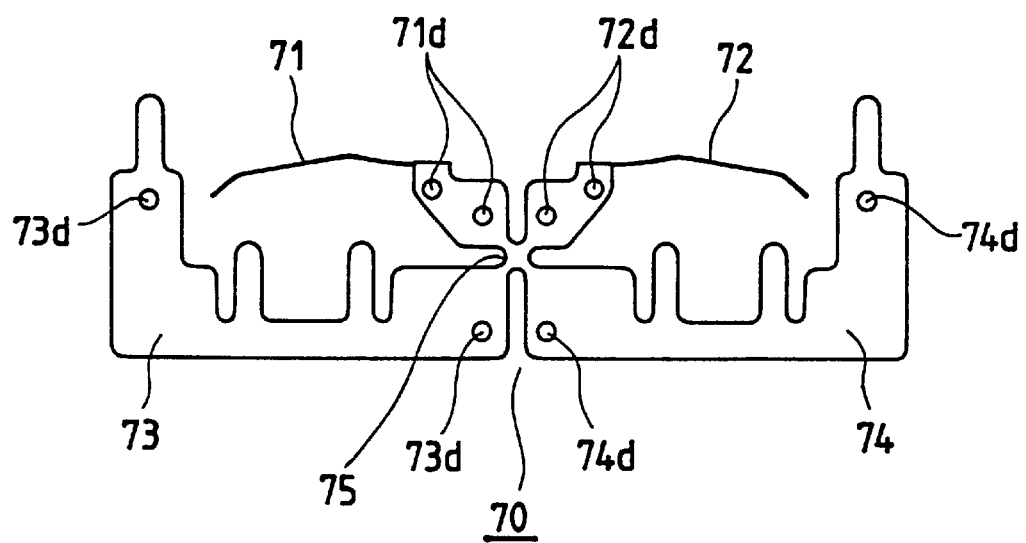
FIG. 19 is a plan view of an integral molded piece for a battery connecting spring to be attached to the battery holding frame.

Referring now to the plan view of FIG. 19, a configuration of a battery connecting spring for connecting the positive and negative terminals of the batteries to positive and negative terminals of a circuit board will be described.

A battery connecting spring 70 is obtained by integrally forming a nickel-plated stainless-steel plate, in which a pair of positive-side springs 71 and 72 and a pair of negative-side springs 73 and 74 are connected to one another at a center junction 75. The battery connecting spring 70 is formed with four slits, which extend lengthwise and crosswise toward the center junction 75. Further, the positive-side springs 71 and 72 are formed with through holes 71d and 72d, respectively, and the negative-side springs 73 and 74 are formed with through holes 73d and 74d, respectively.

Figure 20:
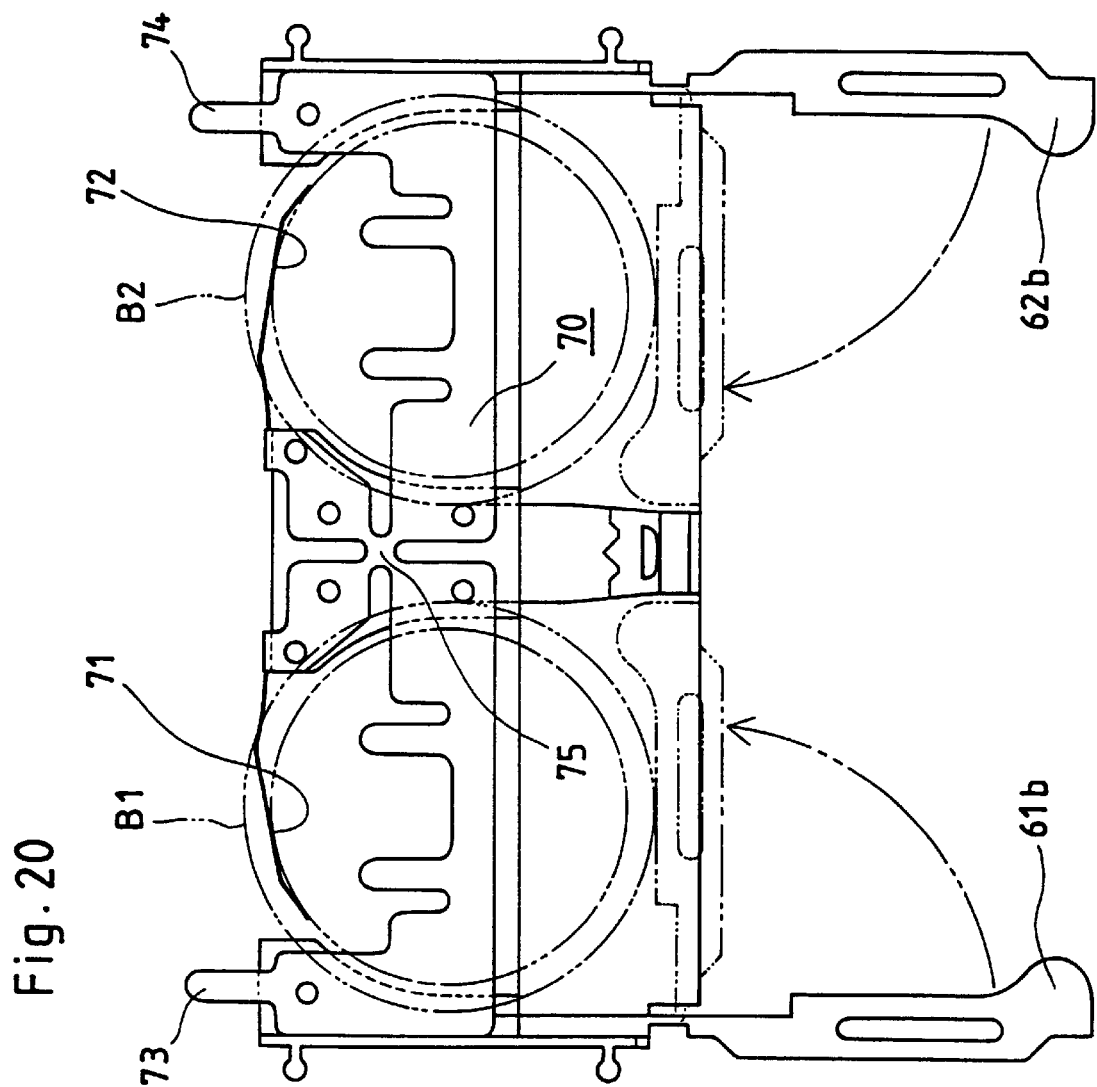
FIG. 20 is a view showing the battery holding frame of FIG. 18 fitted with the battery connecting spring of FIG. 19.

The respective diameters and dispositions of the through holes 71d, 72d, 73d and 74d of the battery connecting spring 70 correspond to the respective diameters and dispositions of the protrusions 61d, 62d and 63d, individually. Thus, the battery connecting spring 70 of FIG. 19 can be mounted overlapping the battery holding frame 60 of FIG. 18 by individually passing the protrusions 61d, 62d and 63d of the battery holding frame 60 through the through holes 71d, 72d, 73d and 74d of the battery connecting spring 70 and then caulking the respective upper ends of these protrusions 61d, 62d and 63d. FIG. 20 shows the resulting state. In the state of FIG. 20, the center of the through hole 63e of the central member 63 vertically overlaps the center of the center junction 75 of the battery connecting spring 70.

In FIG. 20, chain-line circles individually represent the batteries B1 and B2 set in the battery holding frame 60. When the battery covers 61b and 62b are closed after the batteries B1 and B2 are set in the battery holding frame 60, the respective negative terminals of the batteries B1 and B2 press down the negative-side springs 73 and 74, respectively, thereby maintaining the contact between the negative terminals of the batteries B1 and B2 and the negative-side springs 73 and 74 and the contact between the negative-side springs 73 and 74 and negative terminal (not shown) of the circuit board. On the other hand, the respective positive terminals (inside chain-line circles) of the batteries B1 and B2 force the positive-side springs 71 and 72 to bend rearward, thereby maintaining the contact between the positive terminals of the batteries B1 and B2 and the positive-side springs 71 and 72, and the contact between the positive-side springs 71 and 72 and positive terminal (not shown) of the circuit board.

Figure 22:
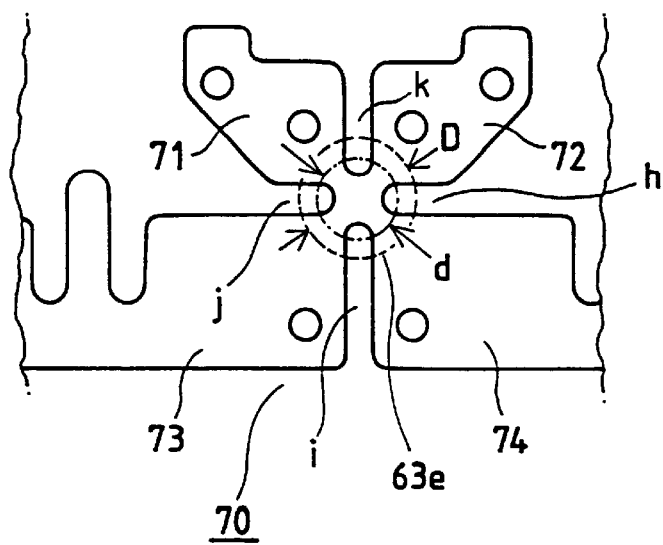
FIG. 22 is a view for illustrating a method for stamping the battery connecting spring of FIG. 20 to divide it into four parts, a pair of positive terminal springs and a pair of negative terminal springs.

Since the positive-side springs 71 and 72 and the negative-side springs 73 and 74 of the battery connecting spring 70 shown in FIG. 20 are still connected to one another by the center junction 75, they must be separated. Referring to FIG. 22, therefore, a method of dividing the spring 70 will be described below.

Figure 21:
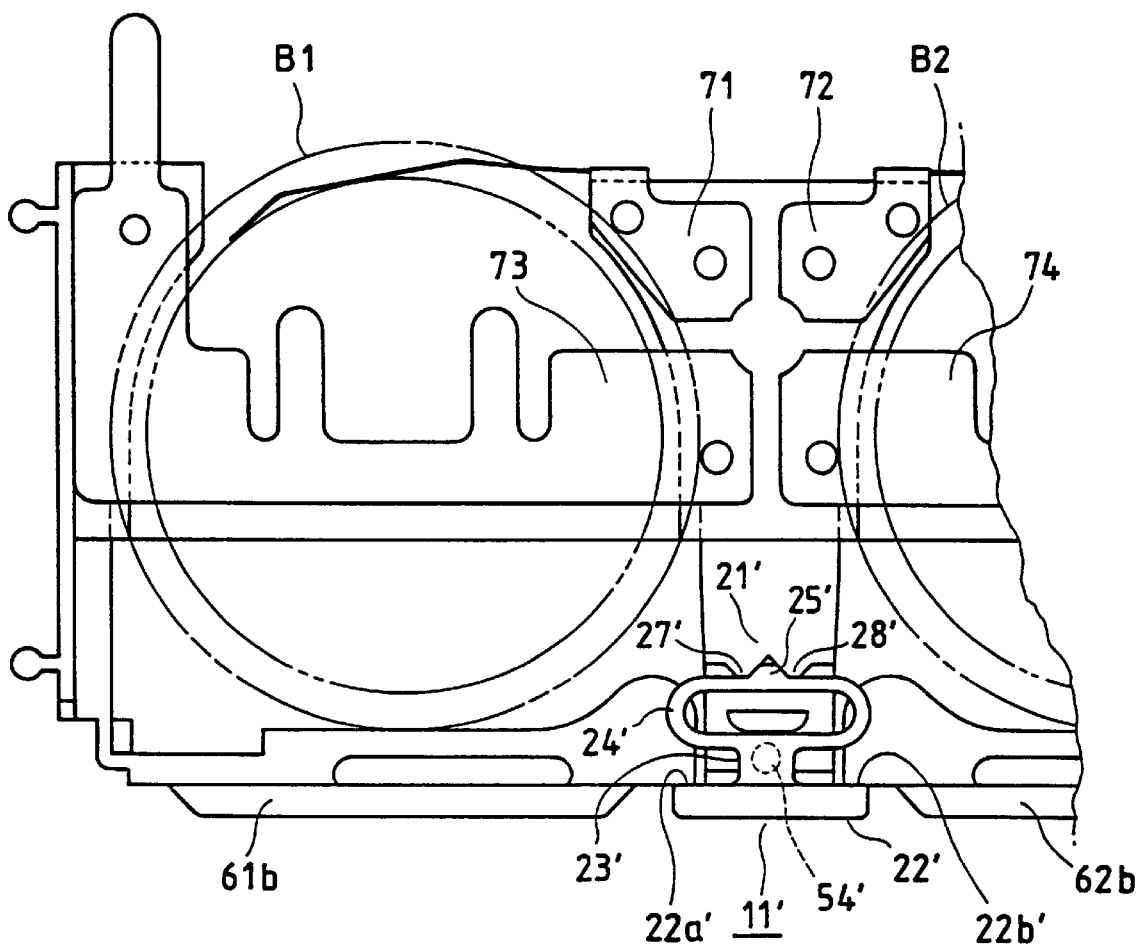
FIG. 21 is an enlarged view showing the principal part of the memory card according to the second embodiment of the present invention.

FIG. 22 is an enlarged view showing a region near the center junction 75 of the battery connecting spring 70 of FIG. 20. The center junction 75 is situated right over through hole 63e (diameter D) of the central member 63 of the battery holding frame 60. The outside chain-line circle of FIG. 22 represents this through hole 63e (diameter D). By punching out the center junction 75 with a punching tool (having a diameter corresponding to inside chain-line circle of FIG. 22) that is concentric with the through hole 63e and has a diameter d smaller than the diameter D, four slit portions h, i, j and k of the battery connecting spring 70 are left connected adjacently, whereupon the springs 71, 72, 73 and 74 are separated from one another. The punched-out center junction 75 is removed through the through hole 63e that has the diameter D (>d). FIG. 21 shows the separated springs 71, 72, 73 and 74.

Referring now to FIG. 21, retention of the battery covers 61b and 62b by means of a stopper will be described.

A stopper 11' has the same form and function as the stopper 11 (see FIG. 9) according to the first embodiment. More specifically, the stopper 11' includes a slide knob 22' attached to the front end portion of the central member 63 of the battery holding frame 60 to be slidable in the width direction of the card body 2, a leg portion 23', provided integrally with a slide guide pin 54', an oblong overhang portion 24', formed on the distal end of the leg portion 23', and an angular positioning projection 25', formed on the front end of the overhang portion 24'.

On the other hand, the stopper positioning portion 21', formed on the central member 63 of the battery holding frame 60 like that of the first embodiment, is formed with two angular projections 27' and 28'.

In this embodiment, as in the first embodiment, therefore, when the slide knob 22' is brought to a center position (position of FIG. 21), both the distal end portions of the left- and right-hand battery covers 61b and 62b are pressed down by left- and right-hand locking portions 22a' and 22b', respectively, which are formed on the rear surface of the slide knob 22', so that the left- and right-hand battery covers 61b and 62b are locked in a closed state. When the slide knob 22' is slid to the right from the position of FIG. 21 to disengage the positioning projection 25' from an engaging recess between the two projections 27' and 28' of the battery holding frame 60, the engagement between the left-hand battery cover 61b and the left-hand locking portion 22a' is removed, so that the left-hand battery cover 61b can be manually lifted to allow the battery B1 inside to be taken out. At this time, the engagement between the right-hand battery cover 62b and the right-hand locking portion 22b' of the slide knob 22' is maintained, so that the right-hand battery cover 62b cannot be lifted. Also when the slide knob 22' is slid to the left from the position of FIG. 21, the right- hand battery cover 62b can be lifted to allow the battery B2 inside to be taken out, though the left-hand battery cover 62b is kept locked.

According to the second embodiment described above, the through hole 63e having the diameter D is first formed in the central member 63 of the battery holding frame 60; the center junction 75 of the battery connecting spring 70 is placed on the through hole 63e of the battery holding frame 60; and a hole having the radius d (<D) is bored through the center junction 75 by punching. Instead of forming the through hole 63e, the central member 63 of the battery holding frame 60 may be formed with a bottomed hollow with the diameter D for use as a relief space. In the case where the bottomed hollow is used, however, the punched center junction 75 should be pulled up as the punching tool is retreated.

Since the electrical circuits between the batteries B1 and B2 and the load are arranged in the same manner as those of the first embodiment (FIGS. 15 to 17), a description thereof is omitted.

What is claimed is:

1. A portable information device comprising:
 a body casing for containing a circuit board and having first and second battery insertion slots in one end thereof; and
 a battery holding frame arranged in an internal space of said body casing, wherein:
 said battery holding frame comprises a partitioning member, a first battery cover and a second battery cover that are integrally formed,
 said partitioning member is formed at a central portion of the battery holding frame and positioned in a boundary area between said first and second battery insertion slots of the body casing,
 said first battery cover is formed at a left-hand portion of the battery holding frame, while said second battery cover is formed at a right-hand portion of the battery holding frame,
 a locking member is arranged in the battery holding frame at a position opposing said partitioning member for keeping said first and second battery covers closed,
 bare batteries are placeable in the battery holding frame by movement in a direction perpendicular to the direction of the thickness thereof after passing through said battery insertion slots, and
 said first and second battery covers come into contact with the circumferential surfaces of the bare batteries placed in the battery holding frame when closed.

2. A portable information device according to claim 1, wherein said first and second battery covers have hinge portions situated in the vicinity of left- and right-hand portions of the end of the body casing which is formed with the battery insertion slots so that the respective free ends of the battery covers are allowed to reach positions for engagement with said locking member when the battery insertion slots are closed.

3. A portable information device according to claim 1, wherein said battery holding frame is formed of one integrally molded piece of plastics.

4. A portable information device according to claim 1, wherein the left-hand portion and right-hand portion of the battery holding frame include first and second guide portions for guiding the batteries inserted through the first and second battery insertion slots to inside fixed positions and holding the same in the fixed portions.

5. A portable information device according to claim 4, wherein said first and second guide portions are formed integrally with the battery holding frame.

6. A portable information device according to claim 5, wherein the left-hand portion and right hand portion of the battery holding frame are fitted with a first battery connecting spring and a second battery connection spring for connecting the first and the second batteries housed in the left-hand portion and the right-hand portion of the battery holding frame and power source terminals of the circuit board in the body casing.

7. A portable information device according to claim 6, wherein each of the first and second battery connecting springs is formed of a first pair of springs to be in contact with positive and negative terminals of the battery and a second pair of springs to be in contact with positive and negative terminals of the battery.

8. A portable information device according to claim 7, wherein said first pair of springs and said second pair of springs are made available by cutting off a junction of one metal plate disposed in the battery holding frame and consisting of four sections.

9. A portable information device according to claim 8, wherein said junction is cut off with said one metal plate fixedly positioned with respect to the battery holding frame so that the four sections of said metal plate, when having its junction cut off and separated, remain intact in said battery holding frame and individually form the first and the second battery connecting springs for connecting the batteries and the power source terminals of the circuit board.

10. A portable information device according to claim 9, wherein said junction is cut off by a single punching stroke.

11. A portable information device according to claim 8, wherein, said battery holding frame includes a region which is adapted to overlap the junction of said one metal plate when the metal plate is fixedly positioned with respect to the battery holding frame, and a through hole or a hollow having a diameter larger than a diameter for the punching of the junction of the metal plate, said through hole or hollow being formed as a relief space to be used in punching.

12. A portable information device according to claim 1, wherein said first and second battery covers are capable of opening and closing through a left-hand hinge portion and right-hand hinge portion which are formed on and integral with said battery holding frame.

13. A portable information device according to claim 12, wherein said hinge portion is made by forming a narrowed portion at an end of the battery cover.

* * * * *